(12) United States Patent
Birk

(10) Patent No.: US 10,311,759 B2
(45) Date of Patent: Jun. 4, 2019

(54) PRESSURE COMPENSATION LABEL FOR STICKING TO A SURFACE, AND METHOD

(71) Applicant: Schreiner Group GmbH & Co. KG, Oberschleissheim (DE)

(72) Inventor: Uwe Birk, Munich (DE)

(73) Assignee: Schreiner Group GmbH & Co. KG, Oberschleissheim (DE)

( * ) Notice: Subject to any disclaimer, the term of this patent is extended or adjusted under 35 U.S.C. 154(b) by 211 days.

(21) Appl. No.: 15/129,941

(22) PCT Filed: Apr. 9, 2015

(86) PCT No.: PCT/EP2015/057749
§ 371 (c)(1),
(2) Date: Sep. 28, 2016

(87) PCT Pub. No.: WO2015/155299
PCT Pub. Date: Oct. 15, 2015

(65) Prior Publication Data
US 2017/0132954 A1    May 11, 2017

(30) Foreign Application Priority Data
Apr. 11, 2014  (DE) .................. 10 2014 105 193

(51) Int. Cl.
*B32B 37/22* (2006.01)
*B65D 25/20* (2006.01)
(Continued)

(52) U.S. Cl.
CPC ............. *G09F 3/02* (2013.01); *B01D 63/087* (2013.01); *B32B 3/266* (2013.01); *B32B 3/30* (2013.01);
(Continued)

(58) Field of Classification Search
CPC .. H05K 5/0213; H05K 5/068; B65D 2205/00; B65D 2205/02; B65D 2205/025;
(Continued)

(56) References Cited

U.S. PATENT DOCUMENTS

| 6,506,110 | B1 | 1/2003 | Borisch |
| 7,687,135 | B2 | 3/2010 | Birk |

(Continued)

FOREIGN PATENT DOCUMENTS

| CN | 1806163 A | 7/2006 |
| CN | 101171453 A | 4/2008 |

(Continued)

OTHER PUBLICATIONS

International Search Report of PCT/EP2015/057749, dated Jul. 3, 2015.

(Continued)

*Primary Examiner* — Catherine A. Simone
(74) *Attorney, Agent, or Firm* — Collard & Roe, P.C.

(57) ABSTRACT

A pressure compensation label for sticking to a surface, provided with a pressure compensation opening, of a housing or some other article, has a first film for sticking to a surface provided with a pressure compensation opening, and an outer, second film and also an air-permeable membrane film which is arranged between the first film and the second film. The first film has a cutout, intended for positioning over a pressure compensation opening, and a number of ventilation ducts. Each of the ventilation ducts is separated from the cutout by a film region of the first film. The membrane film covers the cutout and each of the film regions between the cutout and the number of ventilation ducts. The outer, second film extends laterally beyond the membrane film, at least regionally covers the number of ventilation ducts of the first film laterally outside the membrane film, and spans a (Continued)

ventilation path which leads from that surface of the membrane film that faces the second film to the number of ventilation ducts in the first film.

14 Claims, 7 Drawing Sheets

(51) Int. Cl.
    *B65D 77/22*     (2006.01)
    *B32B 38/04*     (2006.01)
    *B32B 38/10*     (2006.01)
    *H05K 5/02*     (2006.01)
    *H05K 5/06*     (2006.01)
    *B32B 3/30*     (2006.01)
    *B32B 3/26*     (2006.01)
    *G09F 3/10*     (2006.01)
    *G09F 3/02*     (2006.01)
    *B01D 63/08*     (2006.01)
    *B32B 5/02*     (2006.01)
    *B32B 37/02*     (2006.01)

(52) U.S. Cl.
    CPC .............. *B32B 5/022* (2013.01); *B32B 5/024* (2013.01); *B32B 37/02* (2013.01); *B32B 37/22* (2013.01); *B32B 38/04* (2013.01); *B32B 38/10* (2013.01); *B65D 25/205* (2013.01); *B65D 77/225* (2013.01); *G09F 3/10* (2013.01); *H05K 5/0213* (2013.01); *H05K 5/068* (2013.01); *B32B 2038/042* (2013.01); *B32B 2305/188* (2013.01); *B32B 2305/20* (2013.01); *B32B 2307/724* (2013.01); *B32B 2307/7265* (2013.01); *B32B 2519/00* (2013.01); *B65D 2203/02* (2013.01); *B65D 2205/00* (2013.01); *G09F 2003/0233* (2013.01); *G09F 2003/0236* (2013.01); *G09F 2003/0272* (2013.01)

(58) Field of Classification Search
    CPC ................. B65D 77/225; Y10T 428/28; Y10T 428/24744; Y10T 428/2848; Y10T 428/14; F16K 51/00; F16K 51/02; G09F 3/10; B32B 3/266; B32B 3/30; B32B 38/04; B32B 38/10; B32B 37/22
    See application file for complete search history.

(56) References Cited

U.S. PATENT DOCUMENTS 8,968,063 B2     3/2015     Gifford et al.
2009/0047896 A1     2/2009     Wolff

FOREIGN PATENT DOCUMENTS

| CN | 202145715 U | 2/2012 |
|---|---|---|
| CN | 102893712 A | 1/2013 |
| DE | 10 2005 021 301 A1 | 11/2006 |
| EP | 0 377 067 A1 | 7/1990 |
| EP | 1 034 692 B1 | 7/2001 |
| EP | 1 051 889 B1 | 7/2002 |
| EP | 1 593 478 A1 | 11/2005 |
| EP | 1 630 769 A1 | 3/2006 |
| EP | 1 806 039 B1 | 5/2010 |
| WO | 2004/099749 A1 | 11/2004 |
| WO | 2006/120707 A1 | 11/2006 |
| WO | 2009/142987 A1 | 11/2009 |
| WO | 2011/143551 A1 | 11/2011 |

OTHER PUBLICATIONS

Chinese Search Report dated Aug. 13, 2018 in CN 201580019312.X.
Chinese Office Action dated Aug. 22, 2018 in CN 201580019312.X.

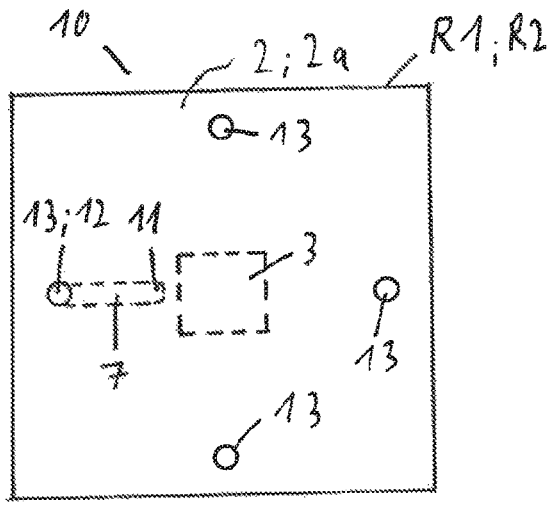
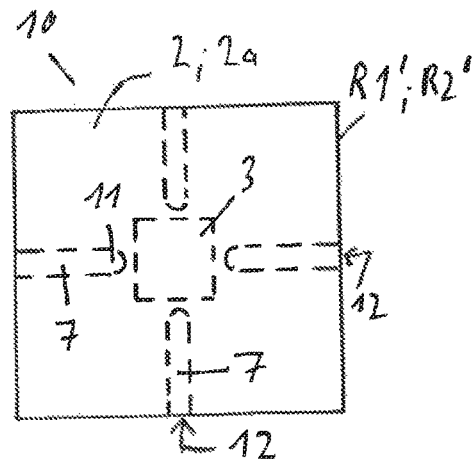
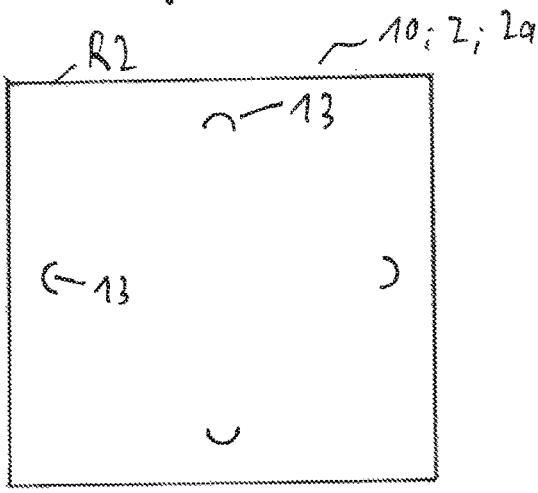
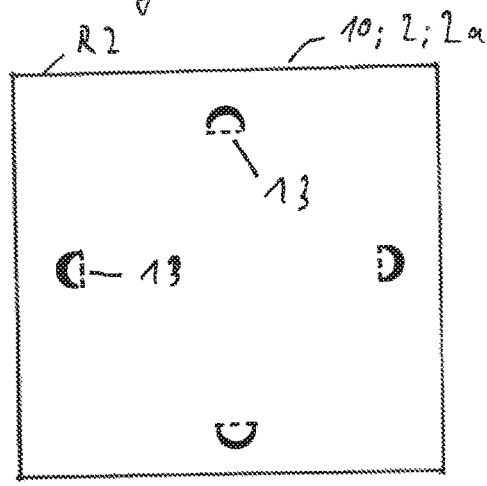
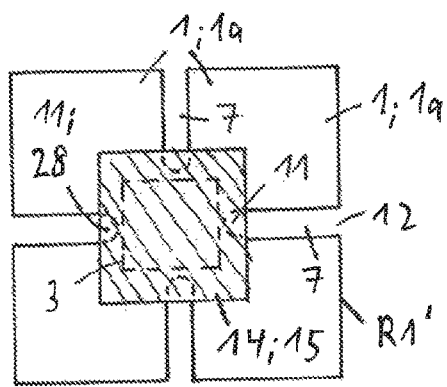
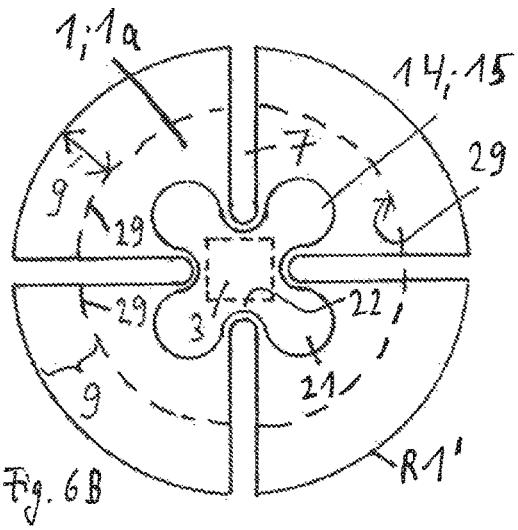

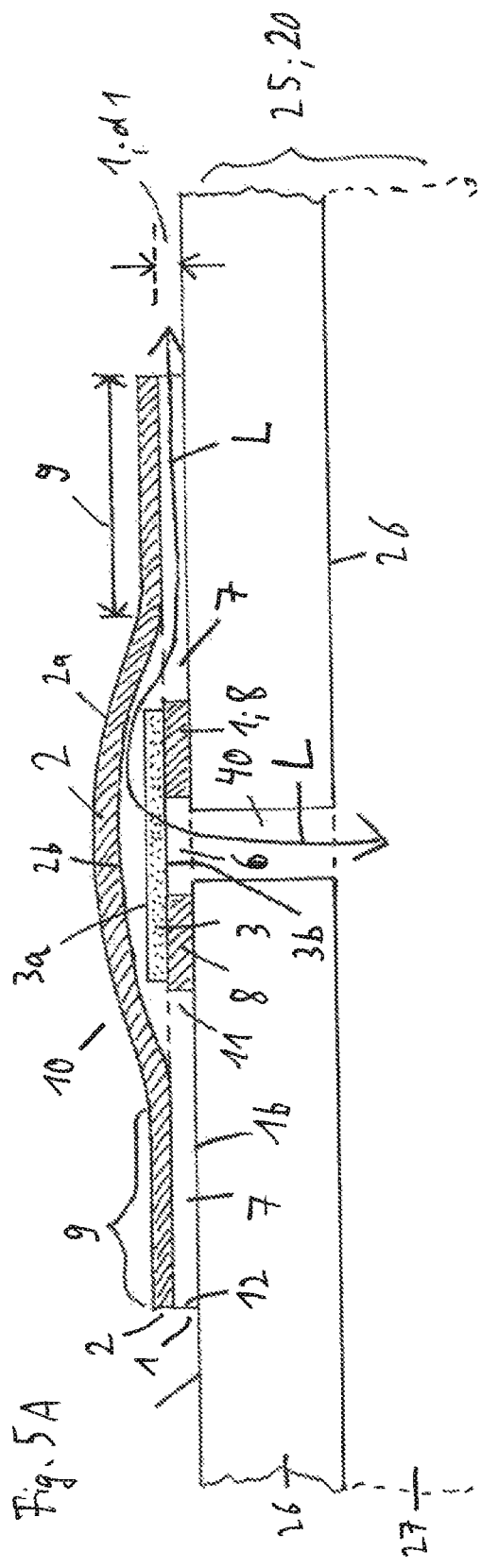
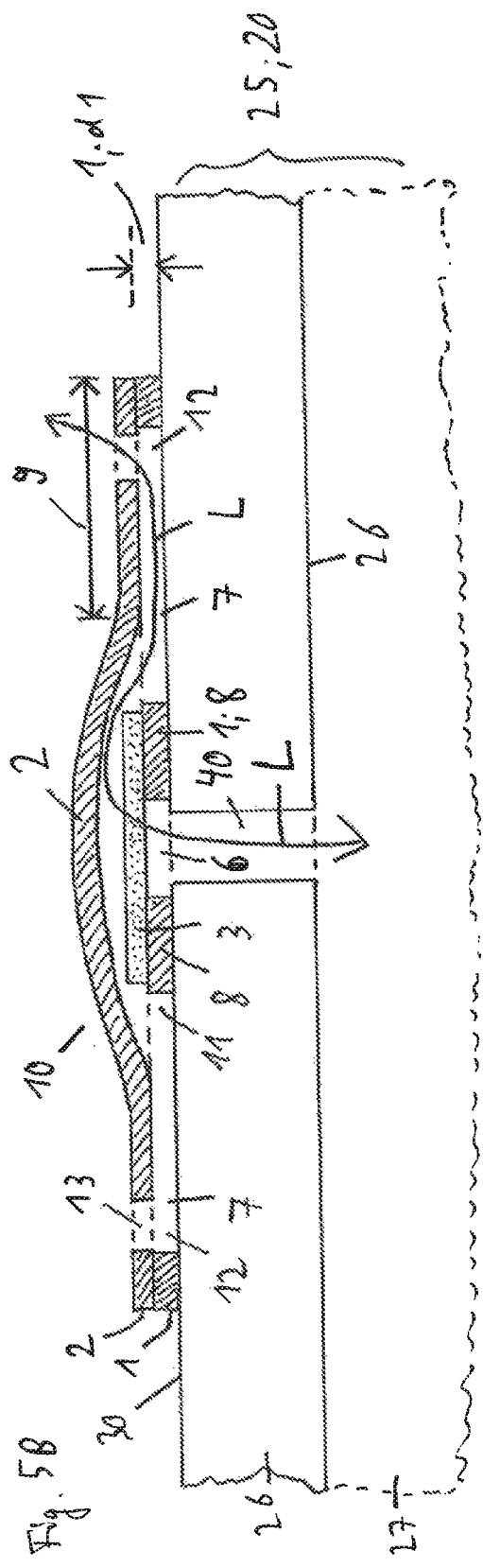

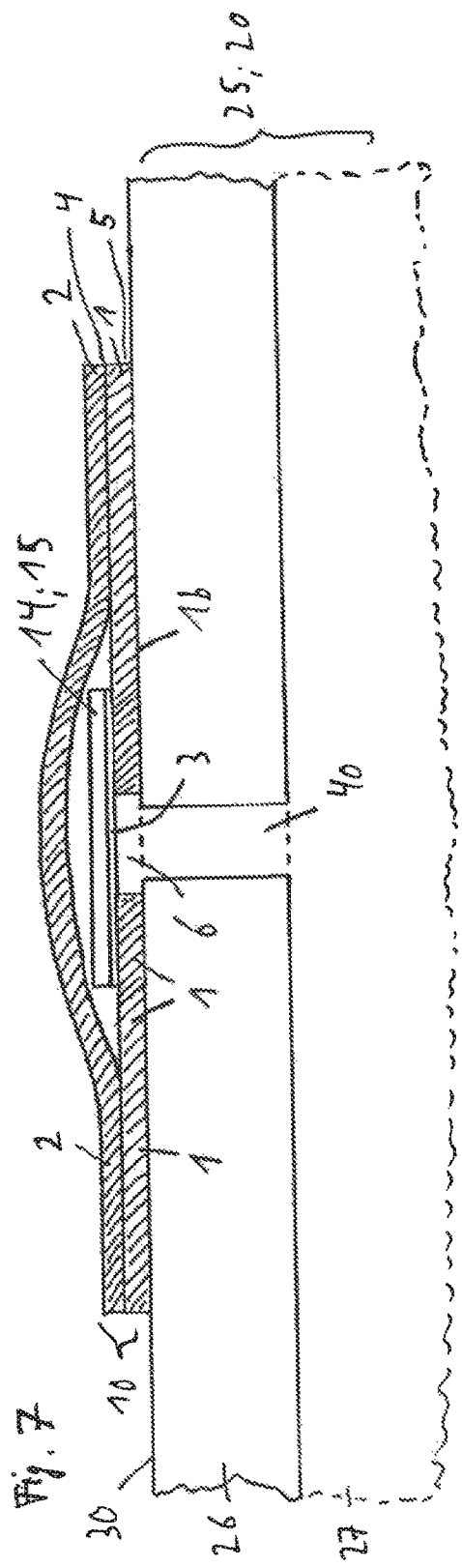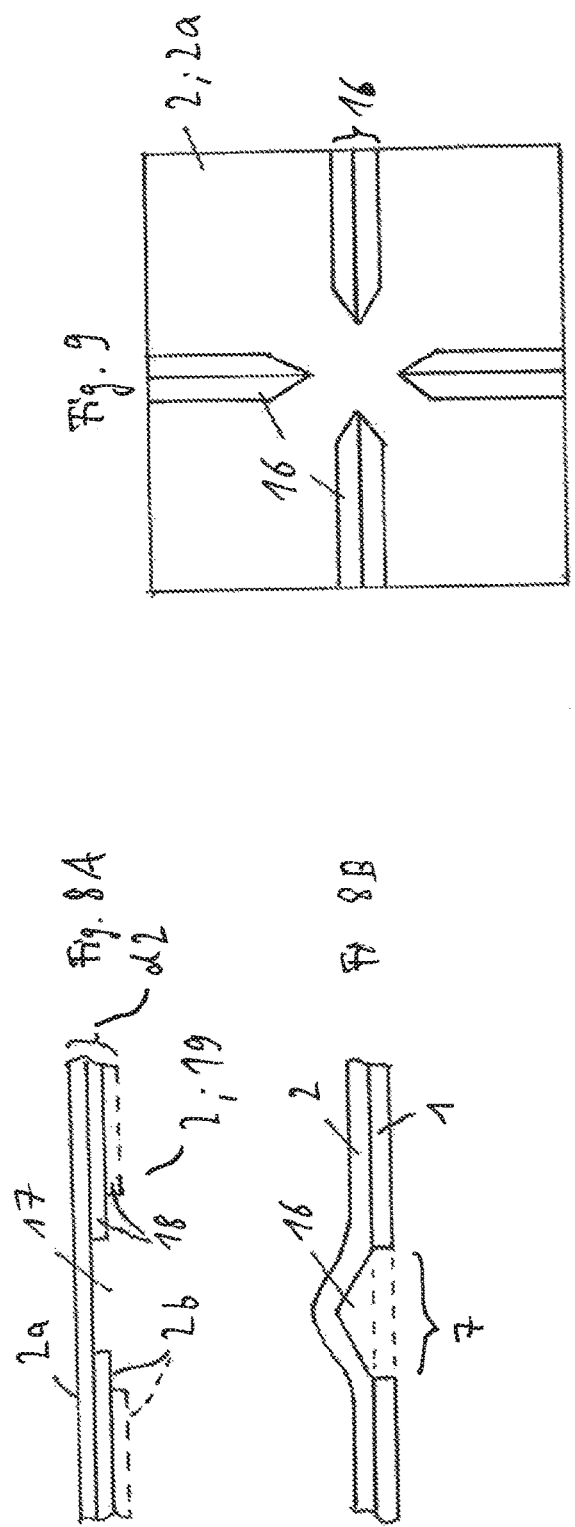

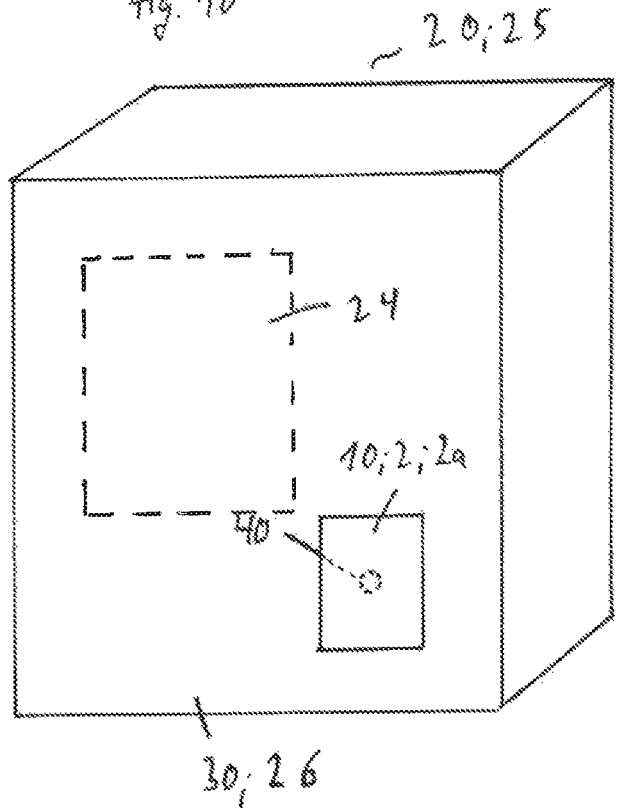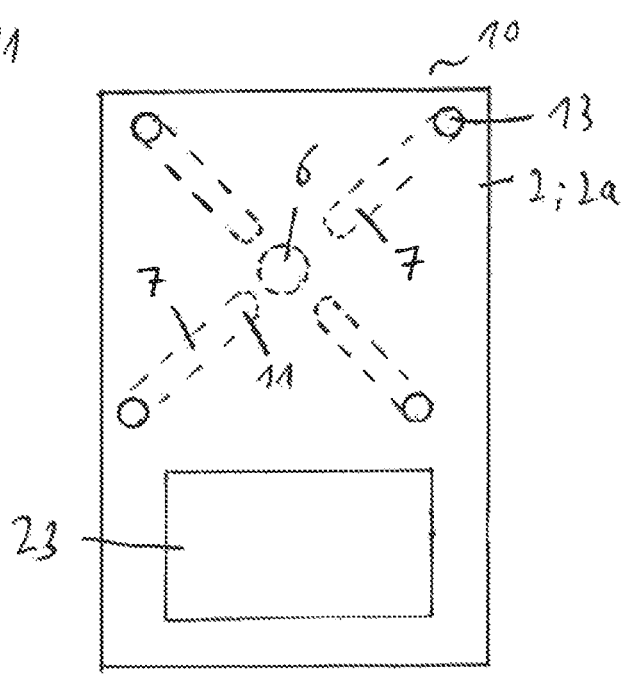

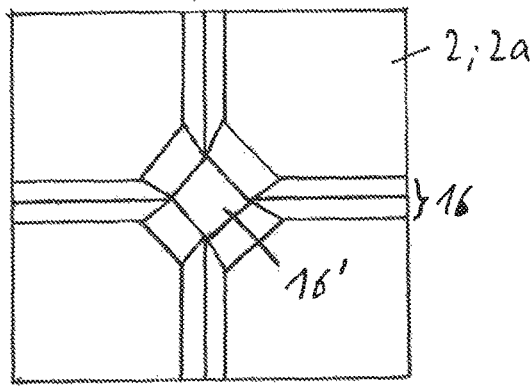
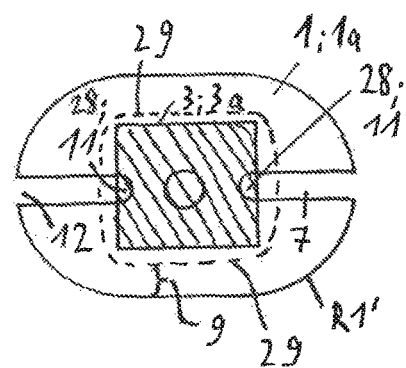
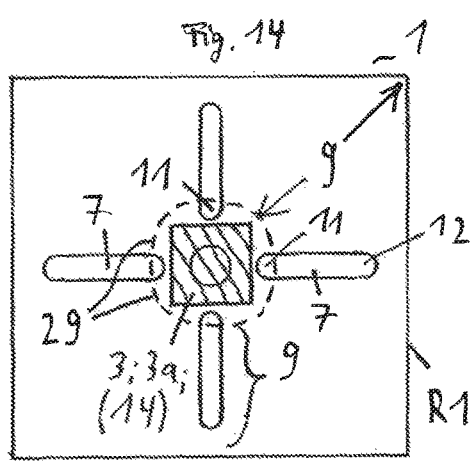
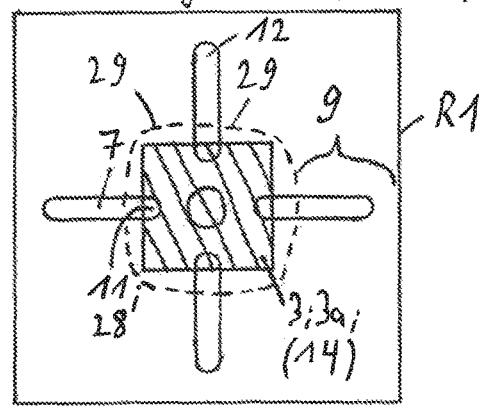
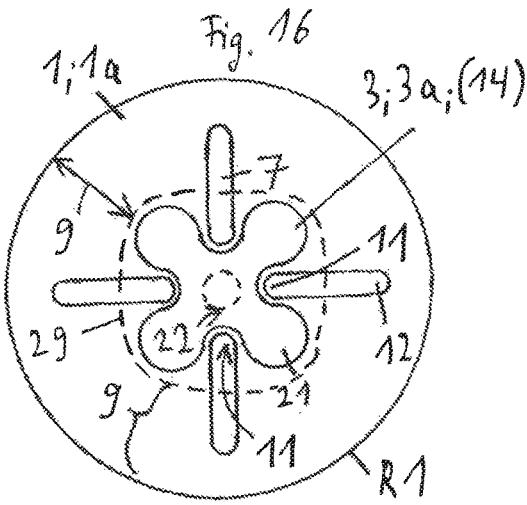
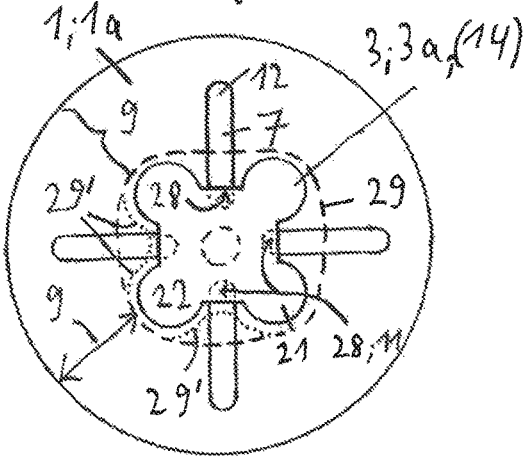

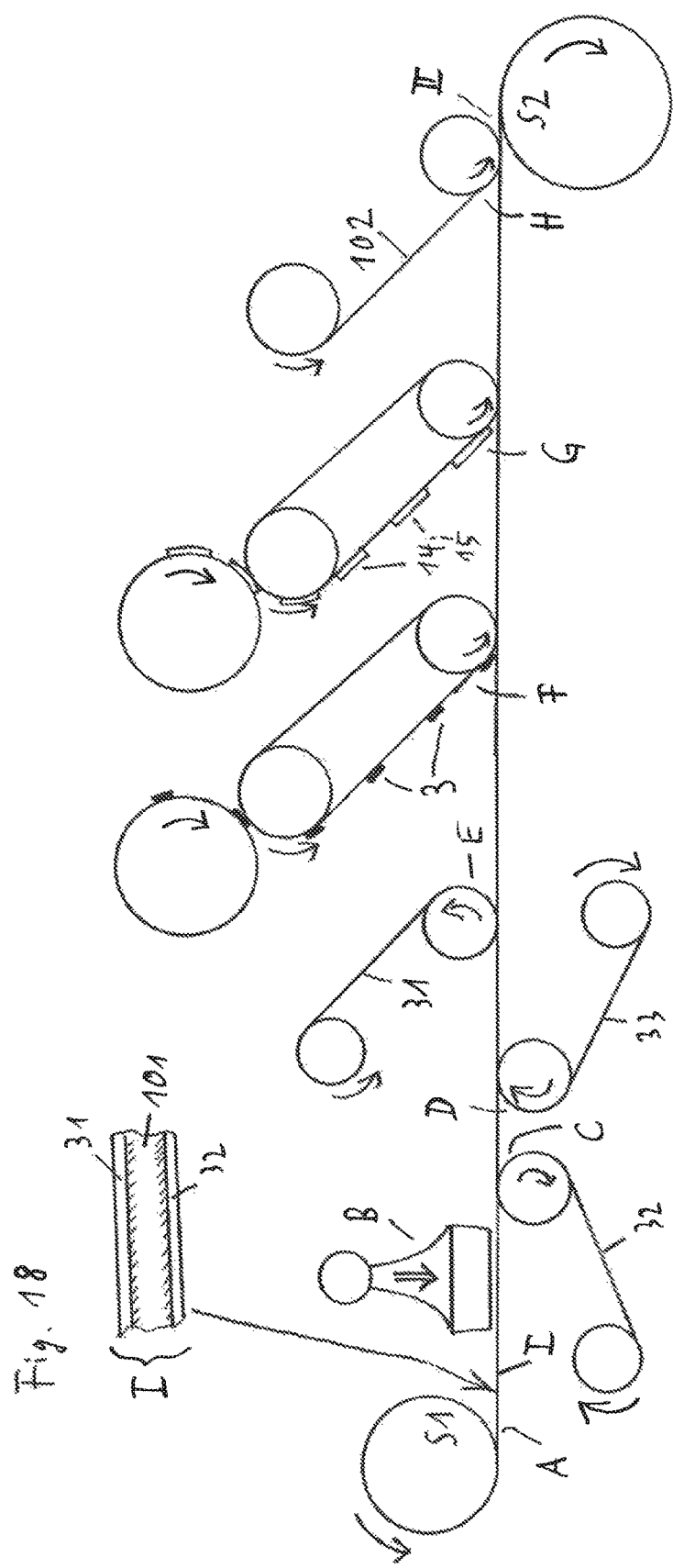

PRESSURE COMPENSATION LABEL FOR STICKING TO A SURFACE, AND METHOD

CROSS REFERENCE TO RELATED APPLICATIONS

This application is the National Stage of PCT/EP2015/057749 filed on Apr. 9, 2015, which claims priority under 35 U.S.C. § 119 of German Application No. 10 2014 105 193.9 filed on Apr. 11, 2014, the disclosure of which is incorporated by reference. The international application under PCT article 21(2) was not published in English.

BACKGROUND OF THE INVENTION

1. Field of the Invention

The application relates to a pressure compensation label for adhesive affixation to a surface of a housing or another article, which surface is provided with a pressure compensation opening. The application furthermore relates to a method for the production of pressure compensation labels.

2. Description of the Related Art

The most varied systems, devices, components or individual parts in mechanical engineering, in automotive construction or in other areas of application possess pressure compensation openings. Housings or outer housings, above all, are often provided with one or more pressure compensation openings. In the case of devices that are operated at temperatures that vary over different times of day or different seasons, or devices that themselves produce heat because of their power consumption, pressure compensation openings are necessary, for example, so that the air situated in the device housing can expand as necessary, depending on the operating temperature, or can partly leave the housing, or so that air can flow back into the housing when it cools.

Particularly in components that are installed in motor vehicles or other means of transport for controlling vehicle parameters, the electronics inherent in the component produce heat, which heats not only the component and its housing, but also the air enclosed therein. Without pressure compensation, excess pressure would occur in the housing of the electronic component, relative to the outside surroundings, which pressure can reach up to 300, 500 or even 700 mbar, depending on the ambient temperature, intensity of use, and electric power consumption of the electronic component during its operation. Similar problems of pressure compensation can occur, other than in automobile construction, also in other machines, industrial systems or devices. Housings of electronic components are therefore often provided with pressure compensation openings, for example in the form of boreholes or other passages in the housing wall.

Such pressure compensation openings do not remain exposed, but rather are covered in such a manner that pressure compensation by means of gas exchange continues to be possible, but wetness or moisture and water cannot penetrate into the housing of the component. Aside from solid, three-dimensionally formed closures for pressure compensation openings, closures in the form of pressure compensation labels are particularly used; these can be produced from foils/films and are therefore relatively cost-advantageous. But label-like pressure compensation closures must also be robust enough to withstand weathering influences and other mechanical stresses, in particular the forces that occur when using steam-jet degreasers or high-pressure washers. Such conditions of use have required a rather complex structure of pressure compensation labels until now, in which structure support structures between the foils/films can also be required in addition to foils/films and adhesive layers.

SUMMARY OF THE INVENTION

It is the task of the present invention to make available a pressure compensation label that has the simplest possible structure, can be produced in the simplest possible manner, and is therefore inexpensive, which label is mechanically very stable and resistant to external mechanical stresses. Furthermore, a method is supposed to be made available, with which method mechanically resistant pressure compensation labels can be produced in simple and cost-advantageous manner.

This task is accomplished by means of the pressure compensation label and method according to the invention.

The pressure compensation label according to the invention possesses a lower, first film and an outer, second film disposed above the latter or further up, as well as a membrane film. According to this application, the membrane film is disposed between the first film and the second film. The membrane film is gas-permeable and particularly air-permeable, but impermeable for moisture and water or other liquids. The membrane film is a thin layer composed of a suitable membrane material; for this purpose, any conventional membrane film can be used. The first film disposed underneath the membrane, the underside of which film is to be adhesively affixed or is adhesively affixed to the surface of the device, of the electronic component or of the housing, possesses a recess—in practical manner, in its center—that is to be positioned precisely above the pressure compensation opening of the device or of the housing. This recess in the lower, first film forms the device-side access to the underside of the membrane film of the pressure compensation label. The first film is otherwise adhesively affixed onto the housing wall of the device or of the electronic component with its underside or by means of an underside adhesive layer, specifically in the immediate vicinity of the pressure compensation opening to be sealed off. A circular-ring-shaped or circular-disk-shaped surface region of the housing has the pressure compensation label adhesively affixed to it, for example, wherein the pressure compensation label also covers the pressure equalization opening itself, of course, specifically with the membrane film and also with the outer, i.e. upper second film. The first and the second film are, in particular, plastic films.

The first film and the second film extend laterally beyond the membrane film; in particular, their edge regions can run completely around the membrane film, laterally outside of the membrane film.

It is provided that the first film also has a number of ventilation channels in addition to the recess for the pressure compensation opening. These channels are worked into the first film or are an integral part of it. Furthermore, it is provided that each of the ventilation channels in the first film is separated from the recess for the pressure compensation opening by a respective film region of the first film. Therefore separation regions exist between the central recess above the pressure compensation opening and the ventilation channels in the first film, which regions block a direct connection between the central recess and the ventilation channels, as material bars or material bridges in the film plane. These film regions do not need to be configured or reinforced in any particular manner, but rather are merely film regions of the first film that have remained intact, in other words have not been punched out or weakened or machined in some other way. While the recess and the ventilation channels in the first film can be implemented as punched-out parts of the first film, the film regions made available for their separation represent intact bridge regions between the recess and the ventilation channel or the ventilation channels, for example, which regions have not been machined by means of punching or other effects.

In the case of this film structure of a pressure compensation label, in which the membrane film is disposed above the first film, i.e. between the first and the second film, a person skilled in the art would usually configure the further ventilation path at a level above the membrane film or at least above the first film, because when the housing heats up, the enclosed air, which reaches the membrane film through the pressure compensation opening of the housing and the recess of the first film, exits from the membrane film on its top. According to this application, however, the further ventilation path is passed back into the plane of the lower, first film, i.e. down into the plane of the first film 1, which is to be adhesively affixed onto or has been adhesively affixed directly onto the housing of the electronic component or the other device. As a result of this positioning of the ventilation channels or further recesses, the first film, which is responsible for direct adhesion of the pressure compensation label to the housing, might tend to look structurally rather weakened in a top view, and therefore the introduction of ventilation channels into the first, lowermost film, of all things, might appear to be absurd, at first glance. However, in this method of construction—in connection with further characteristics that will be explained below—a mechanically robust overall structure of the pressure compensation label can be achieved, in particularly simple manner, particularly since the first film is held in shape both during label production and after dispensing of the pressure compensation label, on both sides, by the adjacent material surfaces, and furthermore itself offers a greatly enlarged, almost full-area adhesive surface.

First of all, it is provided that the membrane film covers the recess as well as the film regions between the recess and each of the ventilation channels. For example, the recess for the pressure compensation opening and its entire edging are covered by the membrane film, and thereby sealed in moisture-sealed manner. Furthermore, it is provided that the outer film, i.e. the second film, extends laterally beyond the membrane film, that the second film covers the number of ventilation channels of the first film laterally outside of the membrane film, at least in certain regions, and that the second film furthermore spans a ventilation path that leads from the surface of the membrane film that faces the second film all the way to the number of ventilation channels of the first film. If the air in a housing to which the pressure compensation label described here is adhesively affixed therefore heats up, it first passes through the membrane film before reaching the ventilation channels, as it passes through the label.

Because of the fact that the second film (just like the first film) extends laterally beyond the membrane film, the further ventilation path toward the outside can be structured solely using the first and second film, thanks to the ventilation channels introduced into the first film. Actually, additional layers for the channels or at least elevated adhesive dots would have to be provided between the two films, so that the air can escape to the outside between them or can flow in again. Particularly in the outer region—close to the circumference of the pressure compensation label—additional films, adhesive dots, material layers or other structures with embedded channels would actually have to be configured in order to implement the ventilation path from the membrane top or its center to the outside, i.e. toward the surroundings of the label.

However, because the first film already carries a number of ventilation channels within it according to this application, such additional adhesive dots, film layers or structures can be eliminated without replacement. In regions laterally outside of the membrane film, the second film serves as a top cover for the ventilation channels; it is adhesively affixed to the first film, specifically over the full area, if at all possible. The gaps of the first film—with the exception of their inner, if necessary also their outer channel ends—are covered by the second film and form the ventilation channels to the outside. In order not to interrupt the ventilation path between the membrane top and the channel openings, it is sufficient if the first and the second film do not lie directly one on top of the other at least on a narrow region around the membrane film, but rather possess a certain distance from one another. Otherwise, no further structures for channel guidance are required in the ring-shaped outer region of the pressure compensation label, i.e. laterally outside of the membrane film.

Depending on the embodiment, further structures for widening the ventilation path between the inner end of the respective ventilation channel and the membrane top can otherwise be provided.

The pressure compensation label described here first of all possesses no cover of the ventilation channels from below, but rather makes use of the circumstance that after the label is dispensed, the housing surface itself encloses the first film from below. In the case of conventional pressure compensation labels, if they carry ventilation channels in them, the ventilation channels are already worked into the label in finished form, i.e. delimited both upward (in the direction away from the housing surface) and also downward (in the direction toward the housing surface). In the case of a pressure compensation label according to this application, in contrast, the underside delimitations of the ventilation channels are only "formed" when the label is dispensed onto the device surface or housing surface.

In the case of the label described here, the second film lies directly on the first film, over a large area, laterally outside of the membrane. As a result of this large-area contact surface region, within which the first and the second film border on one another directly or are separated at most by an adhesive layer that lies between them, the pressure compensation label is particularly stable and mechanically resistant to external mechanical stresses, including pressure forces and shear forces. Furthermore, the label makes do with fewer films or other components, and can therefore be produced in particularly simple and cost-advantageous manner.

The ventilation channels ensure lateral offset of the respective outer opening in the label and the membrane top, in order to protect these from destruction by high-pressure washers or steam-jet degreasers, or from other stresses and/or contaminants. Depending on the embodiment, the ventilation channels of the first film can optionally lead to the outside at the outer edge of the first film or—if the outer channel end does not reach all the way to the film edge—can lead to the outside through channel exit openings of the second film.

BRIEF DESCRIPTION OF THE DRAWINGS

Some exemplary embodiments will be described below, with reference to the figures. These show.

DETAILED DESCRIPTION OF THE PREFERRED EMBODIMENTS

Figure 1A:
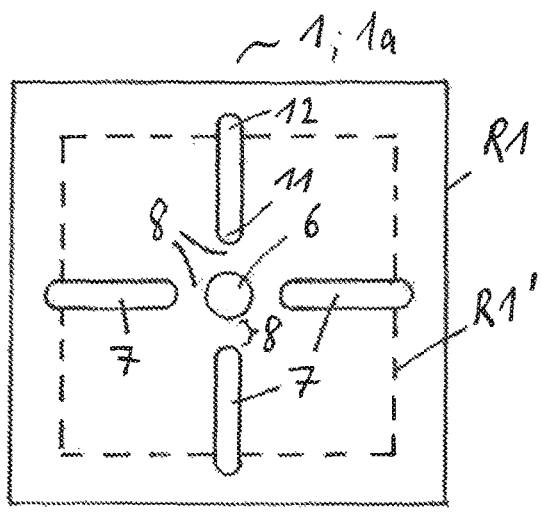
FIGS. 1A to 1C, exemplary embodiment patterns of the lower, first film of a pressure compensation label, FIGS. 2A to 2C, exemplary cutouts of a membrane film on the first film from FIGS. 1A to 1C, FIGS. 3A to 3B, schematic top views of the outer, second film of a pressure compensation label, based on FIGS. 1A and 2A, respectively, FIGS. 4A and 4B, alternative exemplary embodiments with regard to the channel exit openings of the second film in FIG. 3A, FIGS. 5A and 5B, schematic cross-sectional views of pressure compensation labels, for exampled based on FIG. 3A, FIGS. 6A and 6B, two exemplary embodiments having an additional, air-permeable layer as a spacer on the membrane film, FIG. 7, a schematic cross-sectional view relating to an embodiment similar to that of FIG. 6A or 6B, FIGS. 8A and 8B, two modified exemplary embodiments with regard to the shape of the second film, FIG. 9 a schematic top view of the second film from FIG. 8B, FIG. 10 an article provided with a pressure compensation label, FIG. 11 a further embodiment of a pressure compensation label, FIG. 12 an alternative embodiment to FIG. 9, FIG. 13 an alternative embodiment to FIG. 2C, FIG. 14 a supplemental schematic view relating to FIG. 2A, with the additional representation of the contact surface region and its inner edge, FIG. 15 an alternative embodiment to FIGS. 2A and 14, with a membrane film that overhangs the inner ends of the ventilation channels, FIG. 16 a supplemental schematic view relating to FIG. 2B, with the additional representation of the contact surface region and its inner edge, FIG. 17 an alternative embodiment to FIGS. 2B and 16, with a membrane film that overhangs the inner ends of the ventilation channels, and FIG. 18 a schematic representation of an exemplary method for the production of pressure compensation labels.
Figure 1B:
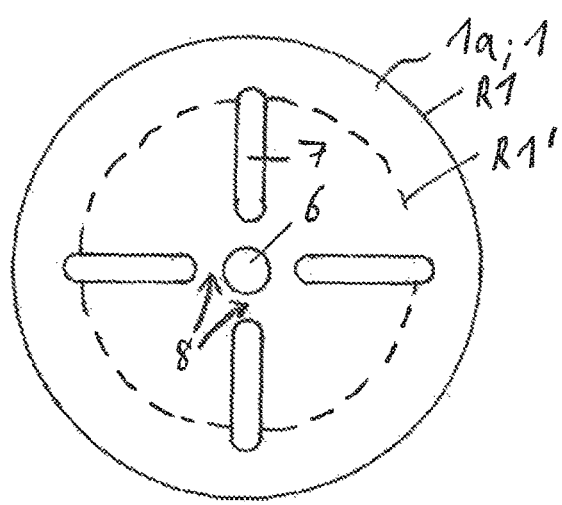
Figure 1C:
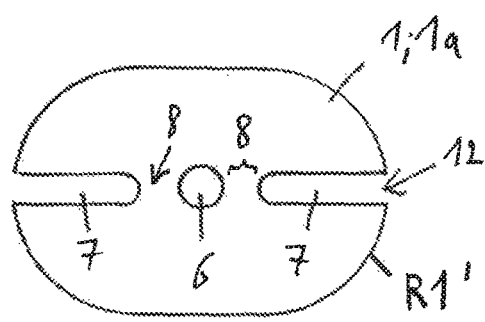

FIGS. 1A to 1C show some exemplary embodiment patterns for the lower (or inner, i.e. to be adhesively affixed directly to the surface of the device or housing) first film of the pressure compensation label. The views of the first film 1 shown in FIGS. 1A to 1C can be implemented, for example, as a cut pattern or punched pattern; in particular, a number of ventilation channels in the form of gaps or recesses can be configured outside of the central passage openings, above all as punched-out parts of the first film. The height of the ventilation channels then corresponds to the layer thickness d1 of the first film (cf. FIGS. 5A and 5B). However, the ventilation channels in the first film can alternatively be configured also as weakened film regions, particularly thinned in comparison with the remaining film thickness. In the simplest case, however, the first film is simply punched out in the region of the recess for the pressure compensation opening and also in the region of the ventilation channels, i.e. provided with a corresponding inner opening.

FIG. 1A shows a first exemplary embodiment, in which the first film 1, which is shown in square shape here, has a centrally disposed recess 6, which comes into coverage with the pressure compensation opening of a housing surface when the finished pressure compensation label 10 (FIGS. 5A and 5B) is adhesively affixed to this surface. The pressure compensation opening of a housing of an electronic component or of an electronic device is generally circular in its layout; the same preferably holds true for the recess 6 of the first film 1.

The first film 1 additionally has a number of ventilation channels 7; these are preferably elongated and lead from the inside to the outside in the lateral direction, in each instance, i.e. from a region close to the recess 6 to an edge region at a distance from the recess 6. For example, each ventilation channel 7 runs in a straight line, i.e. linearly; approximately as shown, radially in the direction from the center of the first film 1 of the pressure compensation label (or its recess 6) all the way to the label edge. Each ventilation channel 7 possesses an inner end 11 and an outer end 12. The inner end 11 is separated from the recess 6, which is provided for the pressure compensation opening, by means of a film region 8, in each instance.

As will still be described as an example using some of the following figures, the inner end of the ventilation channels can optionally be covered with the membrane film or, instead, can be overlaid by the second film (at a certain height above the first film).

In the latter case, it is guaranteed by the thickness of the membrane film, which reaches at least close—for example between 0.5 and 1.0 mm—to the inner end of each ventilation channel, and, if applicable, also by the thickness of a spacer above the membrane film, that the second film spans the inner ends of the ventilation channels at a distance from the first film. Therefore the second film does not lie directly on the inner ends of the ventilation channels, but rather the further ventilation path, which leads from the top of the inner ends of the ventilation channels all the way to the center of the top of the membrane film, which lies higher, is kept clear by means of the distance of the second film from the first film above the inner ends of the ventilation channels. From there, the air then passes through the air-permeable membrane film during pressure compensation, and then gets into the interior of the cooling housing or device, through the central recess of the first film and through the pressure compensation opening of the housing or device, over which the label is adhesively affixed. In contrast, when a housing or device is heating up, part of the air expanding in its interior passes through the ventilation path in the pressure compensation label in the opposite direction, and gets to the outside through the ventilation channels.

In the first case, as well, when the inner end of the ventilation channels is covered by the membrane, at least in certain regions, the second film is at a distance from the first film—now as the result of the edge of the membrane film that lies in between; and from the inner ends of the ventilation channels, the further ventilation path—through the interstice between the outer edge of the membrane film and the underside of the second film—also runs further to the center of the top of the membrane film.

The ventilation channel 7 or the number of ventilation channels 7 therefore does not reach all the way to the central recess 6, but rather the latter is completely surrounded by an inner film region of the first film 1, and therefore does not possess any lateral passage to the ventilation channels 7 or actually to the outside. The film region that surrounds the recess 6 therefore particularly encompasses the film regions 8 provided for separation from the ventilation channels 7. The film regions 8 therefore serve as barriers or bridge regions, and—just like the recess 6—have a membrane film 3 adhesively affixed over them and are sealed (cf. FIGS. 2A to 2C). The ventilation channels 7, in contrast, run laterally outside of the membrane film and are therefore directly covered by an upper, second film over the major part of their channel length.

FIG. 1A simultaneously shows two alternative embodiments with regard to the outer channel ends 12, depending on where the outer edge of the first film 1 runs. In the one embodiment, the outer edge is formed by R1, i.e. it runs outside of and at a distance from the outer end 12 of the ventilation channels 7. In this regard, the ventilation channels 7 in the first film 1 do not reach all the way to the outer edge R1 of the film. In this embodiment, the second film that is to be adhesively affixed later is provided with its own channel exit openings, which come to lie above the outer channel ends 12 of the ventilation channels 7 of the first film 1.

In the alternative embodiment, also according to FIG. 1A, the outer edge of the first film 1 is formed not by R1, but rather by R1' (shown with a broken line). In this case, the ventilation channels 7 end at the outer edge or film edge indicated with R1', i.e. they lead directly to the outside at the label edge. In this regard, no channel outlet openings are required any longer in an upper, second film, but rather the outer end 12 of each ventilation channel 7 lies at the outer edge of the first film 1.

The above explanations apply likewise for FIG. 1B, which shows a first film 1 having a circular outer contour, as well as for FIG. 1C, which shows a first film 1 having an oblong film outline, for example with a lateral main expanse. The dimensions shown in all figures of this application are merely exemplary and are often shown in enlarged manner; the proportions are also not to scale. The reference symbols apply uniformly for all the figures.

In FIG. 1C, in order to avoid repetition, the film outline is only shown for the embodiment in which the outer ends 12 of the ventilation channels 7 reach all the way to the outer, i.e. circumference-side film edge R1'. The first film 1 can have an oval, polygonal or any other desired outer outline, for example.

Regardless of the embodiment patterns shown, it is likewise possible to provide or punch only a single ventilation channel 7 or another number of ventilation channels 7 in the first film 1. In FIGS. 1A to 1C, the embodiment pattern with the edge R1'—particularly as a punched pattern—might not appear to be very stable for the shape of the first film 1 at first glance (just like later in FIG. 6A or 6B), because the outer film regions of the first film 1 are only held together by the inner film regions 8 between the recess 6 and the ventilation channels 7 that serve as bridge regions. However, the top 1a of the first film 1, shown in FIGS. 1A to 1C, is stabilized by an upper, second film 2 (FIGS. 3A to 4B). Furthermore, the outer regions of the first film 1 are already held in position during production of the label as a whole, on the underside (and before adhesive affixation of the upper, second film, also on the top), by means of a corresponding support film—typically silicone-coated or anti-adhesion-coated paper or a silicone-coated or anti-adhesion-coated polymer film—(FIG. 18 and claims 13 to 15). Even after the finished label as a whole is adhesively affixed, when the first film 1 with its adhesive underside is directly adhesively affixed to a housing surface (FIGS. 5A, 5B, and 7), the film regions of the first film 1 that are disposed between the ventilation channels 7 remain secured to prevent slipping or other deformations, from above and from below.

Figure 2A:
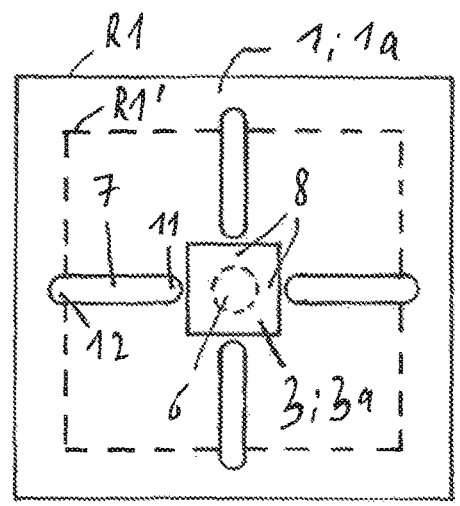
Figure 2B:
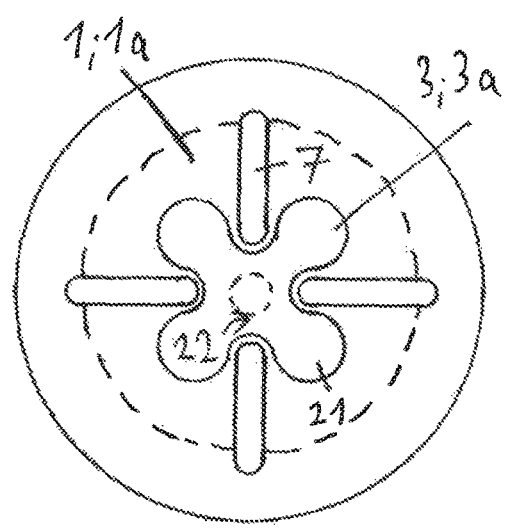
Figure 2C:
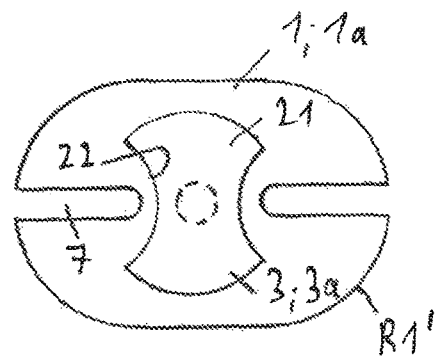

A membrane film 3, which is shown on the top 1a of the first film 1 in FIGS. 2A to 2C, is disposed between the first film 1 and the second film 2 (not yet shown in FIGS. 1A to 2C). The membrane film 3 covers the top 1a of the first film 1 with its underside, specifically in the region of the recess 6 and the inner film regions 8 disposed between it and the ventilation channels 7. The ventilation channels 7, in contrast, are not covered by the membrane film 3. Preferably, the first film 1 is adhesive on both sides; this characteristic can be combined in connection with any desired embodiment according to the figures, claims, or description parts of this application. The membrane film 3 seals the recess 6 off in moisture-tight manner, but is permeable for air and therefore allows pressure compensation of a housing, with the outside surroundings of the housing, at its pressure compensation opening over which the label has been adhesively affixed, without moisture being able to penetrate into the housing interior.

The ventilation path L between the inner ends 11 of the ventilation channels 7 and of the top of the membrane film 3, which will still be explained later using FIGS. 3A to 3C, can be expanded in that—as shown as an example in FIGS. 2B and 2C—the shape of the membrane film 3 is modified relative to a circular or polygonal outline (cf. FIG. 2A). Thus, FIGS. 2B and 2C show that the membrane film 3 can have lateral bulges 21, i.e. projections. Constrictions 22 are present between the bulges 21, where the membrane film 3 possesses a smaller lateral expanse than in the region of the bulges 21. The lateral bulges 21 of the membrane film 3 come into coverage with wing areas (here, quadrants of the film surface), which lie, in each instance, between ventilation channels 7 of the first film 1, which channels are adjacent to one another. Accordingly, the constrictions 22 come into coverage with the film regions 8 that serve as material bridges and lie between the central recess 6 and the ventilation channels 7 of the first film 1, or overlap with the film regions 8, at least in certain regions. Further measures for expanding the ventilation path L will be described further below.

FIGS. 3A and 3B show the finished pressure compensation label 10 from above, i.e. as a top view of the outside 2a of the upper, i.e. second film 2. The membrane film does not reach all the way to the outside edges of the films 1, 2, but rather is at a distance from these, preferably by at least 1.0 mm, in each instance. However, the outer contour of the first film 1 as well as of the second film 2 (and thereby also of the label 10 as a whole) does not have to be square, as shown.

FIG. 3A shows the top 2a of the second film 2 in the event that in FIG. 1A or 2A, the outer edge of the first film 1 is provided by R1, i.e. lies laterally outside of the outer ends 12 of the ventilation channels 7. FIG. 3B, in contrast, shows the top 2a of the second film 2 in the event that in FIGS. 1A and 2A, the outer edge of the first film 1 is provided by R1' and the ventilation channels 7 end at the outer edge R1' of the first film 1.

The figures shown in FIGS. 3A and 3B therefore show the top of the respective finished pressure compensation label 10. The outer contour of the second film 2 corresponds, in FIGS. 3A and 3B, to those of the first film 1. However, this is not necessary; in particular, the second film can be smaller, i.e. less expansive laterally than the first. On the underside, the first film 1 is preferably adhesive over its full area. Preferably, it is also adhesive over its full area or covered with a top adhesive layer over its full area also on the top, i.e. toward the second film. The film is therefore adhesive over its full area on both sides (this preferably holds true in connection with any desired embodiment of this application), and this allows particularly simple production from rolled material.

In FIG. 3A, it can be seen that the second film 2 has channel exit openings 13 where the outer channel ends 12 of the ventilation channels 7 lie underneath it, which openings connect the ventilation channels 7 of the first film 1 with the outside surroundings of the pressure compensation label 10 or of the housing provided with it. In FIG. 3A, the progression of only one of the four ventilation channels 7 underneath the second film 2 is indicated with a broken line; the outline of the membrane film 3 is shown likewise. The top of the membrane film 3 faces the second film 2. The recess 6 and the film regions 8 that surround it, of the lower, i.e. first film 1, are covered by the underside of the membrane film 3. As a result, the recess 6 is covered in moisture-tight but air-permeable manner from above, thereby allowing the desired pressure compensation, but protecting the interior of the article against penetrating moisture. Aside from the channel exit openings 13, the second film 2 is configured to have a full area, i.e. it is free of other openings, interruptions or recesses.

According to FIG. 3B, the second film 2 actually does not possess any kind of recesses, because there, the outer ends 12 of the ventilation channels 7, which coincide with the outer edge R1' of the lower, first film 1, simultaneously form the channel exit openings of the pressure compensation label 10 as a whole.

In the pressure compensation label 10, the ventilation path therefore leads from the outside through the ventilation channels 7 in the lower, i.e. first film 1, from their inner ends 11 further to the center of the surface of the label— specifically at the level between the top of the membrane film 3 and the underside of the second film 2—and from there, finally, through the membrane and the recess 6 and afterward into the labeled article. The region of the surface overlap of the membrane film 3 with the second film 2 is configured to be non-adhesive. Preferably, the entire second film 2 is non-adhesive; neither on the top nor on the underside.

Because the membrane film 3 over which the second film 2 is adhesively affixed represents an elevation relative to the first film 1, the second film arches up slightly over the membrane film 3. Furthermore—even in the case of an adhesive top 1a of the first film 1 over its full area—no adhesive connection of the first film with the second film, reaching all the way to the outer edge of the membrane film 3, is implemented, due to the layer thickness of the membrane film 3. Instead, the surface region designated in this application as a "contact surface region", in which the first and the second film 1, 2 lie directly one on top of the other (and are separated from one another, at most, by a thin adhesive layer having a constant layer thickness), does run around the membrane film 3, but is at a distance, in the lateral direction, from the outer edge of the membrane film 3 (because of the height difference between the membrane film 3 and the first film 1). This lateral distance of the contact surface region of the films 1, 2 from the membrane film 3 represents the ventilation path in the region between the inner ends 11 of the ventilation channels 7 of the first film 1 and the top 3a of the membrane 3 (more precisely: the interstice between the top 3a of the membrane film 3 and the underside of the second film 2). From there, the ventilation path continues further through the membrane film 3 and through the recess 6 of the first film 1, all the way to the pressure compensation opening of the housing to which the label 10 is adhesively affixed. Depending on whether excess pressure or partial vacuum tends to prevail in the housing to which the label is adhesively attached, air flows through the pressure compensation label 10 out of the housing provided with it or into the housing.

FIGS. 4A and 4B show two alternative modifications relating to FIG. 3A, with regard to the configuration of the channel exit openings 13 in the second film 2, the top 2a of which is also shown in FIGS. 4A and 4B. While the channel exit openings 13 are configured in the form of circular or other kinds of recesses in FIG. 3A, for example, according to FIG. 4A merely slot-shaped perforations of the second film 2, for example in the form of inner punched regions, are provided as channel exit openings 13. The inner punched regions are preferably curve-shaped or convolute, for example semicircular, V-shaped, U-shaped or structured in some other way. FIG. 4B shows a modification in which the channel exit openings 13 are implemented by means of tabs that have been bent upward or at least can be bent upward. For this purpose, for example, a punched region is provided as in FIG. 4A (if necessary with an additional bending line, which is represented with a broken line in FIG. 4B), and bent upward within the scope of the production process, to form a semicircular tab, for example. The precise shape of the punched region or tab in FIGS. 4A and 4B is shown merely as an example. Using such slot-shaped inner punched regions or punched lines (FIG. 4A) and/or tabs bent up only by a certain angle (FIG. 4B), the outer end 12 of the respective ventilation channel 7 of the first film 1, situated under the channel exit opening 13, is less severely exposed to external influences such as a high-pressure washer or a steam-jet degreaser, for example.

FIGS. 5A and 5B show exemplary cross-sectional views of an article 20, for example a housing 25, provided with a pressure compensation label 10 according to this application. In each instance, only a housing wall 26 and a part of the interior 27 of the housing situated behind it are shown. The pressure compensation label 10 is situated on the outside or on the outer surface 30 of the housing wall 26, specifically in a suitable position for closing off the pressure compensation opening 40 of the housing 25 or its housing wall 26 in air-permeable but moisture-impermeable manner. For this purpose, the pressure compensation label 10 in FIGS. 5A and 5B is adhesively affixed to the surface 30 in such a manner, in each instance, that the recess 6 of the first film 1 comes into coverage with the pressure compensation opening 40 of the housing 25 or of the other type of article 20. As a result, the pressure compensation opening 40 is covered by that part of the underside 3b of the membrane film 3 that spans the recess 6 of the first film and is adhesively affixed to the film regions 8 all around. The membrane 3 is permeable for gases, particularly air; on its top 3a, the further ventilation path L first leads in the lateral direction beyond the edge of the membrane film 3, and from there into the respective ventilation channel 7 of the first film 1. To illustrate this ventilation path L, FIGS. 5A and 5B show a sectional view at the level of the recess 6 and of two ventilation channels 7, in each instance. With regard to the configuration of the outer end 12 of the ventilation channels 7, FIG. 5A is based on FIG. 3B, according to which the ventilation channels 7 reach all the way to the outer edge R1' of the first film and lead to the outside laterally there. FIG. 5B, in contrast, is based on FIG. 3A in this regard, according to which the outer ends 12 of the ventilation channels 7 are at a distance from the outer edge R1 of the first film 1, and the second film 2 has channel exit openings 13 that lead to the outside, above them. Of course, FIG. 5B can also be modified according to FIGS. 4A and 4B, and, of course, FIGS. 5A and 5B can be combined with any other figure or other embodiment of this application, with regard to all other details as well as combinations of characteristics. For example, the outer contour of the pressure compensation labels 10 in FIGS. 5A and 5B can assume any desired other shape instead of square, can have any other desired number of ventilation channels 7, and/or the outer contour of the membrane film 3 can be modified in any desired manner.

According to FIGS. 5A and 5B, the ventilation path L leads back into the plane of the first film 1 outside of the membrane film or outside of the recess 6 covered by it; the ventilation channels 7 of the film are separated from the recess 6, in each instance, by the material bars or film regions 8 that serve as bridge regions. The film regions 8 thereby block a direct passage between the recess 6 and each of the number of ventilation channels 7; the membrane film can therefore only be cross, but not circumvented.

In FIGS. 5A and 5B, the contact surface region 9 can also be seen even better, in each instance; in this region, the upper, second film 2 lies on the top 1a of the first film 1 with its underside 2b. This contact surface region, in which the two films 1, 2 touch one another (and are welded or glued to one another, for example), is situated exclusively outside of the base surface of the membrane film 3 and furthermore only takes up a base surface, even outside of the membrane film 3, that is at a distance from the outer circumference of the membrane film 3. This holds true, in particular, in the region of the inner channel ends 11 of the ventilation channels 7, from where an unhindered air movement toward the center of the top of the membrane film 3 must be guaranteed.

In the simplest case, as shown in FIGS. 5A and 5B, the height difference between the membrane film 3 and the first film 1 is utilized to guarantee a sufficient distance (all around the membrane film 3) between the membrane film 3 and the contact surface region 9, i.e. the connection region between the films 1 and 2. The lateral distance that exists between the contact surface region 9 and the membrane film 3 makes it possible for air that gets through the membrane film into the interstice between it and the second film 2 can flow further all the way to the inner channel end 11 of the respective ventilation channel 7 and from there through the channel to the outside. In order to guarantee a sufficient cross-section of the ventilation path L in the region of the inner channel end 11 of the ventilation channels 7, the thickness or layer thickness of the membrane film 3 and/or its base surface, for example, i.e. its outer contour, can be selected in suitable manner. For example, the membrane film 3 can have bulges 21 laterally outward in regions between two adjacent ventilation channels 7, in each instance, as shown in FIGS. 2B and 2C. But even in the case of a square cut piece of the membrane film 3, the corner regions reach further outward laterally from the center point of the recess 6 than the edge centers of the membrane. For this reason, the outer edges of the membrane film 3 shown in FIGS. 5A and 5B, which are shown on the left and on the right in the plane of the drawing, are also not in direct contact with the underside 2b of the second film 2, but rather are at a distance from it in the upward direction. The layer thicknesses of the first and second film as well as of the membrane film are represented in exaggeratedly large manner in FIGS. 5A and 5B, so that they can be seen better; the layer thicknesses and layer thickness ratios are not to scale. They can be selected in suitable manner, particularly in order to guarantee sufficient center arch of the second film 2 above the membrane film 3, for example by means of the layer thickness of the membrane film 3 alone. But the membrane base surface can also be configured in suitable manner by means of the geometry or base surface shape of the membrane film 3, for example with bulges 21 as in FIG. 2B, along the diagonal directions between two ventilation channels 7, in each instance.

For further expansion of the ventilation path L between the ventilation channels 7 and the interstice above the membrane top 3a, an additional spacer 14 can be applied to the membrane film 3, as shown in FIGS. 6A and 6B. Thus, FIG. 6A shows a material ply 15, for example, which covers at least the membrane film 3 and, optionally, also the inner ends 11 of the ventilation channels 7. The material ply 15 itself is air-permeable and represents a nonwoven or other kind of woven fabric, for example. It serves as a spacer 14 between the membrane film 3 and the second film 2 (which must still be adhesively affixed to the arrangement in FIG. 6A, in order to obtain the finished pressure compensation label 10). With regard to the outer ends 12 of the ventilation channels 7, FIG. 6A (and FIG. 6B for the case of a circular label) is based on FIG. 3B, by the way; i.e. the second film 2 is configured without any openings, punch-outs or other interruptions.

In FIGS. 6A and 6B, the outer regions of the first film 1, which are separated by the channels 7 and cohesive only by way of the film regions or bridge regions 8 (cf. FIG. 1A, 2A), can be seen even better individually; the same holds true for FIG. 6B. While the spacer 14 is shaped to be square in FIG. 6A, according to FIG. 6B it possesses lateral bulges 21 (and between them, constrictions 22) having a similar shape as in the case of the membrane film 3 in FIG. 2B. Furthermore, not only the membrane film 3 but also the spacer 14 can possess the same base surface or outer contour; if applicable, with these or similar bulges 21. The spacer according to FIG. 6A or 6B increases the size of the up-arch of the second film 2 over the membrane 3 and, above all, at the regions of the first film 1 that border on the latter, and thereby brings about the result that the inner ends 11 of the ventilation channels 7 become more easily accessible from the center of the label. In this regard, the air can also flow through the woven fabric (nonwoven, etc.) of the material ply 15 that serves as the spacer 14, also in the lateral direction. Furthermore, a membrane film 3 can be used, which is already covered and connected with a nonwoven ply or another type of air-permeable material ply on one side. Because of the greater up-arch of the second film 2, the inner edge 29 of the contact surface region 9 is clearly at a greater distance from the membrane 3 or the label center in the radial direction or lateral direction, as shown as an example in FIG. 6B; the ventilation path within the label has widened. The upper, second film 2 is not yet shown in FIG. 6B, but is to be applied to the arrangement shown in FIG. 6B from above during completion of the label, for example by means of laminating it on. Afterward, the second film 2 then lies directly on the first film 1 only in an edge region (in this embodiment, an approximately circular region), namely the contact surface region 9.

FIG. 7 shows a schematic cross-sectional view of an embodiment modified slightly as compared with FIG. 6A or 6B. According to FIG. 7, as in FIG. 6A or 6B, an additional material ply 15 or a spacer 14 is provided on the membrane film 3. As a result, the center up-arch or center arch of the second film 2 over the membrane film 3 is increased, and thereby their reciprocal vertical distance from one another is increased. An air movement or air transport in the material of the material ply 15 (a nonwoven, felt, cloth or other woven fabric) in the lateral direction is even more strongly possible than in the case of the membrane 3, within this material. The material ply 15 therefore does not represent any barrier for pressure compensation, but rather increases the cross-section of the ventilation path. As compared with FIG. 6A or 6B, the modification in FIG. 7 consists in that the spacer 14 possesses the same base surface as the membrane film 3. However, the representation in FIG. 7 was selected in such a manner that the recess 6 does but the ventilation channels 7 do not lie in the drawing plane. For example, the drawing plane in FIG. 7 runs diagonally through the top view of FIG. 6A or 6B. As in FIG. 6A or 6B, the spacer 14 can possess a different, particularly a larger base surface than the membrane 3. Furthermore, the membrane 3 is not supposed to cover the inner channel ends 11 of the ventilation channels 7 in the first film 1. In contrast, it is not harmful if they are covered by the air-permeable material of the spacer 14. Preferably, the spacer 14 (or the membrane or both of them) possesses lateral bulges 21 in regions between the ventilation channels, for example similar to the cloverleaf-like outline structure of FIG. 2B, 6B or 2C. Because of the section plane in FIG. 7, which is rotated by 45", the ventilation channels 7 cannot be seen there. In turn, the contact surface region indicated with the reference symbol 9 in FIGS. 5A and 5B can be seen even better in FIG. 7, as a boundary surface between the two films 1, 2 (shown crosshatched in FIG. 7, in each instance). In the central label region, a great distance between the films 2 and 3 and thereby also a greater lateral distance between the outer edge of the membrane film 3 and the inner edge 29 of the contact surface region 9 (see also FIG. 6B) can be achieved by means of the spacer 14, i.e. an easier or faster air flow or pressure compensation can be achieved. The outer ends of the ventilation channels that cannot be seen in FIG. 7, due to the orientation, can optionally be selected in accordance with the alternatives of FIG. 3A or 3B; i.e. the channels can be guided to the outside toward the side or, alternatively, through the second film 2. Furthermore, adhesive layers on both sides of the first film 1, having the reference symbols 4 and 5, are also indicated in FIG. 7. Preferably, the first film 1 is a film that is adhesive on both sides, over its full area, i.e. already provided with adhesive layers 4 and 5, respectively. The first film 1 is adhesively affixed to the surface 30 of an article 20, for example a housing 25, when the finished pressure compensation label 10 is dispensed, by means of the underside adhesive layer 5, wherein the recess 6 covered by the membrane 3 comes to lie above the pressure compensation opening 40 of the housing wall 26. At the same time, the ventilation channels 7 in the first film 1 of the pressure compensation label 10, which have been open downward until then, are closed off from below, namely by means of the adhesively covered surface 30 of the article itself. A separate, additional film for closing the channels from below or for forming ventilation channels between the first and the second film is therefore no longer required. The pressure compensation labels 10 according to this application are therefore mechanically particularly robust, but at the same time also very simple and cost-advantageous in terms of their production.

The second film 2 in FIG. 7 (like in the other figures, as well) is a film that is non-adhesive on both sides. The adhesive layer 4 is therefore a top adhesive layer of the first film 1. Instead of being provided over the full area, it could also be provided merely in certain regions, in some surface regions of the first film 1.

FIGS. 8A and 8B show two exemplary embodiments with regard to the shape of the second film 2, which can also be transferred to all the other figures of this application. According to FIG. 8A, the second film 2 is a composite film 19, which has two or even more sub-layers 18, for example.

In the region above the ventilation channels 7, particularly above their inner channel end 11, a lower sub-layer 18 of the second composite film 19 can be omitted, i.e. the second film can be thinner there, in order to widen the ventilation path located there. Also, two of three sub-layers 18 can be provided with corresponding recesses 17, which can have different widths, if applicable. According to FIG. 8B, an upward arch 16 over the respective ventilation channel 7, particularly its inner channel end 11, can also be present in the second film 2, in one or more sub-layers, instead of such recesses 17. Such upward arches 16 can be produced, for example, by means of embossing the second film 2, by means of die-cutting or slitting and/or bending, approximately in the form that the second film is raised upward in roof-like or gutter-like manner along the surface regions in which the first film 1 has the ventilation channels 7.

The upward arches indicated according to FIG. 8B are shown, in FIG. 9, in the top view of the top 2a of the second film 2; their positions correspond to those of the ventilation channels 7 of the first film 1. These upward arches 16 are configured more or less locally in comparison with the relatively large-area up-arch of the second film, in total, in its central region, where it is pressed upward by the membrane film 3 and, if applicable, also by the material ply 15 that serves as the spacer 14, during lamination.

By the way, to the extent that this application shows square or otherwise rectangular base surfaces of pressure compensation labels 10 or their films 1, 2, the ventilation channels 7 of the first film and/or upward arches 16 or underside recesses 17 of the second film 2 can, alternatively, also run in the direction of the diagonal of the respective base surface. The ventilation channels 7 then extend all the way into the corners of the base surface or at least close to it, while in the region of the edge centers of the base surface, less film material (particularly of the second film) accrues, which material could oppose the respective bending caused by the up-arches and upward arches during lamination.

Furthermore, the spacer itself can also be embossed into the upper, second film during lamination, i.e. when the first and the second film 1, 2 are pressed together. During lamination or pressing of the two outer films 1 and 2 against one another, channel exit openings 13, as shown in FIGS. 3A, 4A, and 4B, can furthermore also be pushed upright, pressed upright, or set upright into a specific angle position (for example 45° relative to the film plane in FIG. 4B). For this purpose, suitable mandrels or projections of a pressing tool can be pressed upward under the channel exit openings 13 (not shown). Furthermore, the material for the spacer 14 or for the material ply 15 (nonwoven, felt, cloth, woven fabric, etc.) is selected in such a manner that sufficient air transport or sufficiently great gas permeability for effective pressure compensation is guaranteed—also and specifically in the lateral direction laterally through the nonwoven. At the same time, the material is selected in such a manner that it is not excessively compressed when it is pressed together with the second film 2.

FIG. 10 schematically shows an article 20 that is provided with a pressure compensation label 10 according to any desired embodiment of this application. The label 10 is adhesively affixed over a surface 30 of the article 20, in the region around a pressure compensation opening 40. As a result, air exchange between the interior of the article 20 and the surroundings is possible. The article is, for example, a housing 25 or comprises such a housing. The article is, for example, a system, a device, an individual part or an electrical or electronic component 24, particularly for a machine or for a vehicle or some other means of transport.

The article, as an electrical or electronic component 24, can have a circuit board, an electrical or electronic part and/or some other unit that consumes electrical power, for example.

FIG. 11, in an enlarged representation, shows the label 10 that has been adhesively affixed to the article in FIG. 10; it is configured as described below, using FIG. 11, for example, or alternatively, structured according to any other embodiment of this application. According to FIG. 11, the ventilation channels 7, along which air transport in the label 10 takes place in the lateral direction (parallel to the surface 30 of the housing wall 26), in the diagonal direction with reference to the edges of the label base surface, which is rectangular here. Optionally, the label surface is extended in one direction (downward in FIG. 11), i.e. it gets farther away from the recess 6 for the pressure compensation opening 40 along this direction than in the opposite direction and in the lateral directions perpendicular to it. In this way, an inscription 23 (for example by means of screen printing) can be additionally accommodated, for example, and the label can be used not just as a pressure compensation label 10 but also as a nameplate or for some other identification of the article 20. The alphanumeric or other inscription 23 is preferably situated laterally outside of the membrane film 3, i.e. it is disposed without overlap relative to the membrane film 3 and—if the pressure compensation label has a material ply 15 that serves as a spacer 14—also without overlap relative to the material ply 15.

If the pressure compensation label 10 is supposed to have the outer channel outlets for the ventilation channels 7 laterally at the label edge or on the label edge surface, according to any desired figure or other embodiment of this application (instead of on the top of the second film), then—regardless of the final label outline—the surface of the film webs for the first and second films 1, 2 can be selected, at first, to be larger than actually necessary for the label surface, and the label edge can first be punched outside of the range of the ventilation channels 7, for example in accordance with the outer edge R1 or R2 in FIG. 1A, 1B, 2A or 2B. Subsequently, the label surface can be reduced in size by means of a (if necessary repeated) punching process, for example in accordance with the edge R1' or R2' (shown with a broken line in FIGS. 1A, 1B, 2A, 2B, and also underlying FIGS. 3B, 6A, 6B). In this way, the ventilation channels 7 are punched at their outer ends 12 and thereby opened toward the side, wherein the surrounding edge drops away (bled-off punching).

FIG. 12 shows an alternative embodiment to FIG. 9, in which the upward arches 16 (FIG. 8B), in contrast to FIG. 9, run not just along the ventilation channels, above them, but rather are also configured over the central region of the film 2 that covers the membrane film; they extend all the way to the film center and meet one another there. The film 2 therefore has an upward arch 16, which is configured at least also in the central region of the second film 2 (i.e. in the surface region above the membrane film 3), and extends all the way to the surface regions above the ventilation channels 7, specifically at least all the way to over their inner ends 11. In the central region of the second film 2, a widened upward arch 16' or a widened region of it can be configured, for example.

Any upward arches 16 or 16' according to one of FIG. 8B, 9 or 12 can be combined with any desired other figure or embodiment of this application. The upward arches 16 or 16' are preferably film regions formed to stand out by means of embossing, i.e. the project upward on the top 2a of the second film 2 (embossed film). Instead of upward arches 16 or 16' formed by means of embossing, according to FIG. 8B, 9 or 12, such elevations in certain regions, relative to the first film 1, can alternatively be implemented also by means of underside gaps 17 in one or more sub-layers 18 of the second film 2 (composite film 19), approximately as already shown in FIG. 8A. In particular, gaps 17 disposed on the underside 2b of the composite film 19 can have an outline and/or a surface expanse as explained in FIG. 12, using the upward arches 16.

The overhangs 28 shown in FIG. 13 (as well as the corresponding overhangs 28 in the subsequent FIGS. 15 and 17) of the membrane film 3—and optionally also of the material ply 15—beyond the inner ends 11 of the ventilation channels 7 do cover these inner ends, i.e. prevent their use for air transport for pressure compensation. The advantage of this membrane having larger dimensions, which has surface regions that serve as overhangs, consists, however, in that a (tolerance-related, not entirely avoidable during production) lateral offset of the membrane film can no longer lead to the result that any one of the ventilation channels 7 is unintentionally completely covered by the second film. The overhangs 28 therefore prevent the inner edge 29 of the contact surface region 9 from coming to lie closer to the surface center of the label, at any one of the ventilation channels 7, than the innermost end 11 of the ventilation channel 7 in question, thereby blocking this ventilation channel in question and making it ineffective.

FIGS. 13 to 17 therefore show further exemplary embodiments relating to improved positioning of the course of the inner edge 29 of the contact surface region 9 (between the first film 1 and the second film 2). Within the inner edge 29 of the contact surface region 9 between the films 1, 2, the further ventilation path specifically runs in the interstice between them; the ventilation channels 7 are extended all the way to the label center (above the membrane film 3) by means of this path. Of course, the examples of FIGS. 13 to 17 can optionally be combined with closed R1 or R2 or open outer film edges R1' or R2'. They can also be optionally implemented with or without (optional) spacers 14 or the material ply 15 used for them. Furthermore, outline, size and/or shape of all the films 1, 2, 3 as well as the number of ventilation channels 7 can be varied. Corresponding modifications are also conceivable for the exemplary embodiments of FIGS. 1A to 12.

FIG. 13, in concrete terms, shows an alternative embodiment to FIG. 2C, wherein now, the membrane film 3 forms a respective overhang 28 beyond the inner end of each ventilation channel 7. The membrane film (shown with cross-hatching) is square or rectangular, for example; in any case, it covers the inner ends 11 of the ventilation channels 7. Furthermore, the contact surface region 9 between the first film 1 and the second film 2 can be seen, along with its inner edge 29 (shown with a broken line), which encloses the air volume that forms the further ventilation path between the films 1 and 2 (or 3 and 2 above the membrane). As can be seen in FIG. 13, this inner edge 29 does reach relatively close to the outer edge of the membrane film 3, but is still at a sufficient distance from it so that air can flow between the outer membrane edge and the inner edge 29 of the contact surface region 9, down into the ventilation channels 7 of the first film 1 (or—in the opposite direction—can flow from there upward beyond the edge of the membrane film all the way to the membrane top 3a). This lateral distance (all around the membrane film) between the outer membrane edge and the inner edge 29 of the contact surface region 9 does turn out to be relative slight in FIG. 13 (e.g. as the result of a low membrane thickness or layer thickness), but is sufficiently great so as not to interrupt the ventilation path between the ventilation channels 7. Such a distance between the outer membrane edge and the inner edge 29 of the contact surface region 9 is also present in the other exemplary embodiments (particularly those of FIGS. 2A to 7 and 11), even if this distance is shown in the drawing only in FIG. 6B (and was shown significantly larger there, solely because of the layer thickness that is increased in size relative to the membrane by the spacer 14 there (cf. the position of the reference symbol 29 in FIG. 6B)).

FIG. 14 shows a schematic view that supplements FIG. 2A, in which the contact surface region 9 and its inner edge 29 (shown with a broken line) can additionally be seen. The membrane film 3 once again reaches—actually—so far toward the inner end 11 of each ventilation channel 7 that the inner edge 29 of the contact surface region 9 of the two films 1, 2 lies further outward than the inner end 11 of the ventilation channel 7 in question (during the production step of lamination or pressing together of the two films 1, 2 that is used). In the case of tolerance-related incorrect positioning of the membrane film, however, one or more ventilation channels 7 could also be unintentionally closed at their inner end 11).

FIG. 15 shows an alternative embodiment with regard to FIGS. 2A and 14, in which the risk of such channel closure is reduced in that the membrane film has overhangs 28 beyond the inner end 11 of each of the ventilation channels 7. The inner edge 29 of the contact surface region 9 lies farther outside in comparison with FIG. 14.

FIG. 16 shows a supplemental schematic view relating to FIG. 2B—once again with the additional representation of the contact surface region 9 and its inner edge 29. In contrast to FIG. 6B, this edge lies significantly closer to the outer edge of the membrane—either because here, the spacer 14 is missing, or because the membrane 3 and the spacer 14 (having the same or a deviating contour in comparison with the membrane) possess less layer thicknesses than in FIG. 6B. Although the membrane 3 and/or the spacer 14 are provided with lateral bulges 21 and enclose the inner ends 11 of the ventilation channels 7 in U shape (as was already the case in FIG. 2B, 2C or 6B), a certain risk of individual channel closures could still exist in the case of an offset of the membrane and/or of the spacer 14.

FIG. 17 therefore shows an embodiment modified as compared with FIGS. 2B and 16, in which—in addition to the lateral bulges 21 of the membrane 3 and/or of the spacer 14—the membrane 3 and/or the spacer 14 furthermore also have surface regions above the inner end 11 of each of the ventilation channels 7, which serve as an overhang 28. Here, the overhangs 28 are represented as straight edge regions; as compared with FIG. 16, they represent a shortening of the constrictions 22 between the adjacent bulges 21.

According to FIGS. 16 and 17, the inner edge 29 of the contact surface region 9, shown with a broken line, is sufficiently spaced apart from the inner ends 11 of the ventilation channels 7 on all sides, in the case of a correct position of the membrane film 3 and/or of the spacer 14; specifically because of the bulges 21. Only in the case of a particularly low layer thickness of the membrane and/or of the spacer 14 could the inner edge 29 of the contact surface region 9 come to lie dangerously close to the inner channel end 11, between adjacent bulges 21—as shown as an example in FIG. 17, by the dotted (instead of broken-line) inner edge 29' on the left and lower ventilation channel 7—and then can close off this channel, as soon as the incorrect positioning of the membrane film exceeds a certain tolerance value. Even then, however, thanks to the overhangs 28 of the membrane (and, alternatively or in addition due to the overhangs of the spacer 14), it is guaranteed that none of the inner channel ends 11 is closed off.

FIG. 18 schematically shows an exemplary embodiment with regard to a method for the production of a plurality of pressure compensation labels 10. In this method, first a material web I is processed, the structure of which is shown in FIG. 18, top left, on an enlarged scale. The material web I comprises a first film web 101, a first adhesive protection film 31, and a second adhesive protection film 32. The first film web 101 has an adhesive layer on the top and on the underside, i.e. it is adhesive on both sides. According to FIG. 18, for example, the first adhesive protection film 31 is disposed on the top adhesive layer, and the second adhesive protection film 32 is disposed on the underside adhesive layer. Silicone-coated polymer films or silicone-coated paper, for example serve as adhesive protection layers 31, 32 (see also the explanations relating to FIGS. 1A to 1C). The first film web 101, adhesive on both sides, disposed between the first adhesive protection film 31 and the second adhesive protection film 32, serves as the starting material for the production of the first film 1 for a plurality of pressure compensation labels 10 to be produced. In FIG. 18, the top and underside adhesive layer of the first film web 101 are represented as cross-hatched regions close to the two adhesive protection films 31, 32.

The material web I can be present, for example, in the form of many sheets or, as shown in FIG. 18, as rolled material. Thus, for example, a coil S1 of this material web I is unwound to carry out the method described below, i.e. this material web is unrolled from the coil S1 (reference symbol A).

First, in step a) of the method, the recesses 6 and ventilation channels 7 for the labels are punched into the material web I by means of a suitable punch. The punching process is carried out in such a manner that the second adhesive protection film 32 (the underside adhesive protection film in FIG. 18, for example) remains intact and the outlines of the recesses 6 and ventilation channels 7 are punched only through the layers of the first adhesive protection film 31 and of the first film web 101 (reference symbol B). Subsequently, in step b) (reference symbol C), the second adhesive protection film 32 is pulled off or unrolled. In this regard, the pieces of the first film web 101 and of the first adhesive protection film 31 situated within the punched outlines at first remain adhering to the second adhesive protection film 32, i.e. are pulled off or lifted off together with the latter. In step c), another, third adhesive protection film 33 is pressed onto or adhesively affixed onto the side of the first film web 101 that has been exposed in this manner (reference symbol D). Finally, in step d), the opposite, first adhesive protection film 31 is lifted off or pulled off (reference symbol E). Steps c) and d) can also be carried out simultaneously (in FIG. 18, directly one on top of the other on the same piece of the film web 101 then, in each instance).

At this point, it should be pointed out that the method steps here are described in the specific sequence in which they are carried out, one after the other, on a concrete, small piece of the first film web 101, in each instance. The entire method, however, can be carried out as an endless process, wherein new material of the film web 101 is continuously supplied and processed, specifically with all method steps at the same time. In this regard, the listing of the method steps should not be understood in the sense of a strict sequence, at least with reference to the material ply I or with reference to the film web 101.

The one side (in FIG. 18, the underside) of the material web is now once again covered with a full-area adhesive protection film 33, whereas the other side (in FIG. 18, the top) of the first film web 101 is now exposed and has not only punched contours but rather real recesses 6 and ventilation channels 7, which are exposed on the adhesive side. Now, in step e), a plurality of individual membrane films 3 is adhesively affixed over the recesses 6. In this regard, the film regions that separate the ventilation channels 7 from the recesses 6 are also covered adhesively. Supply and application of the membrane films 3 (reference symbol F) takes place by means of a suitably automated unit or machine, which divides a continuous membrane film web (not shown) into film pieces of membrane films 3, having the same size, for example, transfers these pieces to a roll and/or to a conveyor belt at predefined, identical intervals, and from there then positions the above the recesses 6 of the top adhesive first film web 101 and presses them down, in a precise position. In similar manner a plurality of individual spacers 14 can—optionally—be supplied and applied in a subsequent method step (reference symbol G); these spacers serve as an additional material ply 15 between the membrane films 3 and the second film web 102, which is still to be applied.

Finally, in step f), the second film web 102 is applied to the material web that has been prepared in this manner (from the side of the membrane film 3 or the exposed, adhesive side of the first film web 101) (reference symbol H). In this way, a processed material web II is formed as an endless web. This can we wound up onto a further coil S2 for later use, or can also be processed further immediately, to produce pressure compensation labels 10. For the latter, the only thing still required is to punch the ultimate pressure compensation labels 10 out of the material web II. This can be done by means of a punching process (not shown, but can be carried out between H and S2 in FIG. 18), in which the first and the second film web 101, 102 are severed and thereby a plurality of pressure compensation labels 10, as described in this application, are formed. Each of these labels 10 has precisely one recess for being adhesively affixed over a pressure compensation opening 40, as well as one or more ventilation channels 7. During this punching process, the outer edge of the pressure compensation labels 10 is punched, i.e. (depending on the embodiment of the preceding figures), the edges R1 and R2 or, alternatively, the edges R1' and R2'. In this regard, both film webs 101, 102 are punched through at the same time or by means of the same method step, in every case, so that complete, finished labels are produced.

During this process, the third adhesive protection film 33 can also be punched at the same time, or, alternatively, can also be left intact, so that the pressure compensation labels 10 continue to remain adhering to the third adhesive protection film as the ultimate carrier film. The grid can still be pulled off around the individual labels; rolled material containing pressure compensation labels 10, ready for shipping, is formed; these labels have a very simple structure and are produced in very cost-advantageous manner, and particularly make do with fewer film layers than conventional labels.

As can be seen from FIG. 18, the entire method can be carried out in a single operation, even though it comprises a plurality of method steps, which operation can actually be carried out continuously, i.e. for the use of a single, continuously supplied material web that is processed further. This is not known from conventional pressure compensation labels or their production methods; usually, a membrane label, in other words the actual adhesive ventilation element, and the upper protective label have to be produced separately from one another, and these two label parts must then be pressed onto one another, with precise fit. Conventionally and regularly, two separate material webs must first be pre-processed for this purpose, before they can be joined together to form a uniform material web in a later method step (if necessary after corresponding remounting or intermediate storage). Accordingly, as many as three passes of material webs through respective processing lines are actually required conventionally, in order to obtain finished pressure compensation labels 10. In the method according to the present application, however, a single pass of a material web is sufficient to produce a plurality of finished pressure compensation labels 10—actually already pre-assembled as rolled material ready for sale.

REFERENCE SYMBOL LIST 1 first film
1a top
1b underside
2 second film
2a top
2b underside
3 membrane film
3a top
3b underside
4, 5 adhesive layer
6 recess
7 ventilation channel
8 film region
9 contact surface region
10 pressure compensation label
11 inner end
12 outer end
13 channel exit opening
14 spacer
15 material ply
16; 16' upward arch
17 gap
18 sub-layer
19 composite film
20 article
21 bulge
22 constriction
23 inscription
24 component
25 housing
26 housing wall
27 interior
28 overhang
29; 29' inner edge
30 surface
31 first adhesive protection film
32 second adhesive protection film
33 third adhesive protection film
40 pressure compensation opening
101 first film web
102 second film web
A, B, . . . H processing step
d1 layer thickness
I, II material web
L ventilation path
R1, R1'; R2, R2' outer edge
S1, S2 coil

The invention claimed is:
1. Pressure compensation label (10) for adhesive affixation to a surface of a housing or of another article provided with a pressure compensation opening, wherein the pressure compensation label (10) has the following:
  a first film (1) for adhesive affixation to a surface provided with a pressure compensation opening,
  an outer, second film (2), and
  an air-permeable membrane film (3), which is disposed between the first film (1) and the second film (2),
  wherein the first film (1) has a recess (6) intended for positioning above a pressure compensation opening, as well as a number of ventilation channels (7), and wherein each of the ventilation channels (7) is separated from the recess (6) by a film region (8) of the first film (1),
  wherein the membrane film (3) covers the recess (6) and each of the film regions (8) between the recess (6) and the number of ventilation channels (7), and
  wherein the outer, second film (2) extends laterally beyond the membrane film (3), covers the number of ventilation channels (7) of the first film (1) at least in certain regions, outside of the membrane film (3), and spans a ventilation path (L), which leads from the specific surface of the membrane film (3) that faces the second film (2) all the way to the number of ventilation channels (7) of the first film (1), and
  wherein the ventilation channel(s) (7) is/are further recesses of the first film (1), at a distance from the recess (6).

2. Pressure compensation label according to claim 1, wherein each of the ventilation channels (7) leads out of the pressure compensation label (10) at an outer edge (R1') of the first film (1).

3. Pressure compensation label according to claim 1, wherein the second film (2) has a channel exit opening (13) above an outer end (12) of each of the ventilation channels (7) of the first film (1), by means of which the ventilation channel (7) is accessible, wherein the respective channel exit opening (13) is configured in the form of a recess, punch-through, die cut, bent-up film surface, cutting line or other type of opening.

4. Pressure compensation label according to claim 1, wherein the second film (2) is connected with the first film (1) and/or with an adhesive layer (4) disposed above it, in a contact surface region (9) situated outside of the membrane film (3), and wherein each of the ventilation channels (7) is brought closer to the membrane film (3) than the contact surface region (9).

5. Pressure compensation label according to claim 1, wherein the first film (1) has two, three, four, six or some other multiple of ventilation channels (7), which are disposed symmetrically around the recess (6) intended for the pressure compensation opening.

6. Pressure compensation label according to claim 1, wherein the second film (2) has upward arches in surface regions above and/or close to the ventilation channels (7) of the first film (1).

7. Article (20) having a surface (30) that has at least one pressure compensation opening (40), wherein the at least one pressure compensation opening (40) is covered with a pressure compensation label (10) according to claim 1.

8. Pressure compensation label (10) for adhesive affixation to a surface of a housing or of another article provided with a pressure compensation opening, wherein the pressure compensation label (10) has the following:
  a first film (1) for adhesive affixation to a surface provided with a pressure compensation opening,
  an outer, second film (2), and
  an air-permeable membrane film (3), which is disposed between the first film (1) and the second film (2),
  wherein the first film (1) has a recess (6) intended for positioning above a pressure compensation opening, as well as a number of ventilation channels (7), and wherein each of the ventilation channels (7) is separated from the recess (6) by a film region (8) of the first film (1),
  wherein the membrane film (3) covers the recess (6) and each of the film regions (8) between the recess (6) and the number of ventilation channels (7), and
  wherein the outer, second film (2) extends laterally beyond the membrane film (3), covers the number of ventilation channels (7) of the first film (1) at least in certain regions, outside of the membrane film (3), and spans a ventilation path (L), which leads from the specific surface of the membrane film (3) that faces the second film (2) all the way to the number of ventilation channels (7) of the first film (1), and
  wherein the pressure compensation label (10) has an air-permeable spacer (14) between the membrane film (3) and the second film (2).

9. Pressure compensation label according to claim 8, wherein the spacer (14) is an air-permeable material ply (15) composed of a nonwoven, felt, cloth, woven fabric or some other type of air-permeable material.

10. Pressure compensation label (10) for adhesive affixation to a surface of a housing or of another article provided with a pressure compensation opening, wherein the pressure compensation label (10) has the following:
  a first film (1) for adhesive affixation to a surface provided with a pressure compensation opening,
  an outer, second film (2), and
  an air-permeable membrane film (3), which is disposed between the first film (1) and the second film (2),
  wherein the first film (1) has a recess (6) intended for positioning above a pressure compensation opening, as well as a number of ventilation channels (7), and wherein each of the ventilation channels (7) is separated from the recess (6) by a film region (8) of the first film (1),
  wherein the membrane film (3) covers the recess (6) and each of the film regions (8) between the recess (6) and the number of ventilation channels (7), and
  wherein the outer, second film (2) extends laterally beyond the membrane film (3), covers the number of ventilation channels (7) of the first film (1) at least in certain regions, outside of the membrane film (3), and spans a ventilation path (L), which leads from the specific surface of the membrane film (3) that faces the second film (2) all the way to the number of ventilation channels (7) of the first film (1), and
  wherein the pressure compensation label (10) has at least two ventilation channels (7) in the first film (1), and wherein the membrane film (3) possesses recesses, constrictions (22) or at least a smaller lateral expanse in the direction of the ventilation channels (7) than in the directions between adjacent ventilation channels (7).

11. Pressure compensation label (10) for adhesive affixation to a surface of a housing or of another article provided with a pressure compensation opening, wherein the pressure compensation label (10) has the following:
  a first film (1) for adhesive affixation to a surface provided with a pressure compensation opening,
  an outer, second film (2), and
  an air-permeable membrane film (3), which is disposed between the first film (1) and the second film (2), wherein the first film (1) has a recess (6) intended for positioning above a pressure compensation opening, as well as a number of ventilation channels (7), and wherein each of the ventilation channels (7) is separated from the recess (6) by a film region (8) of the first film (1), wherein the membrane film (3) covers the recess (6) and each of the film regions (8) between the recess (6) and the number of ventilation channels (7), and wherein the outer, second film (2) extends laterally beyond the membrane film (3), covers the number of ventilation channels (7) of the first film (1) at least in certain regions, outside of the membrane film (3), and spans a ventilation path (L), which leads from the specific surface of the membrane film (3) that faces the second film (2) all the way to the number of ventilation channels (7) of the first film (1), and wherein the first film (1) is a film that is adhesive on both sides, and wherein the second film (2) is adhesively affixed to the first film (1) in a contact surface region (9) situated laterally outside of the membrane film (3).

12. Method for the production of pressure compensation labels (10), each pressure compensation label (10) of which has the following:

a first film (1) for adhesive affixation to a surface provided with a pressure compensation opening, an outer, second film (2), and an air-permeable membrane film (3), which is disposed between the first film (1) and the second film (2), wherein the first film (1) has a recess (6) intended for positioning above a pressure compensation opening, as well as a number of ventilation channels (7), and wherein each of the ventilation channels (7) is separated from the recess (6) by a film region (8) of the first film (1), wherein the membrane film (3) covers the recess (6) and each of the film regions (8) between the recess (6) and the number of ventilation channels (7), and wherein the outer, second film (2) extends laterally beyond the membrane film (3), covers the number of ventilation channels (7) of the first film (1) at least in certain regions, outside of the membrane film (3), and spans a ventilation path (L), which leads from the specific surface of the membrane film (3) that faces the second film (2) all the way to the number of ventilation channels (7) of the first film (1), and wherein the ventilation channel(s) (7) is/are further recesses of the first film (1), at a distance from the recess (6) wherein the method comprises:

a) punching (B) the recesses (6) and the ventilation channels (7) into a continuous first film web (101) that is adhesive on both sides, the two sides of which web are covered by a first (31) and a second adhesive protection film (32), wherein the first adhesive protection film (31) and the first film web (101) are punched through, whereas the second adhesive protection film (32) remains unpunched, b) removing (C) the unpunched second adhesive protection film (32) from the first film web (101) and, in this regard, removing (C) film pieces of the first film web (101) as well as film pieces of the first adhesive protection film (31) from the punched recesses (6) and ventilation channels (7), in each instance, c) adhesively affixing (D) a third adhesive protection film (33) to the side of the first film web (101) that faces away from the first adhesive protection film (31), d) exposing the other side of the punched first film web (101) by removing (E) the first adhesive protection film (31) from the first film web (101), e) adhesively affixing (F) individual pieces of air-permeable membrane films (3) to the exposed side of the first film web (101), f) adhesively affixing (H) a second film web (102) to the side of the first film web (101) covered with the membrane films (3), and g) punching out a plurality of pressure compensation labels (10) from the material web formed in this manner, which encompasses the first film web (101) and the second film web (102), wherein for each pressure compensation label (10) the first film web (101) forms the first film (1) and the second film web (102) forms the outer, second film (2).

13. Method according to claim 12, wherein in step g), a plurality of first films (1) is punched from the first film web (101), and a plurality of second films (2) connected with the first films (1) is punched from the second film web (102).

14. Method according to claim 12 wherein between steps e) and f), a plurality of individual pieces of an air-permeable material ply (15) is applied to the membrane films (3) and/or to the first material web (101).

\* \* \* \* \*